Figure 1:
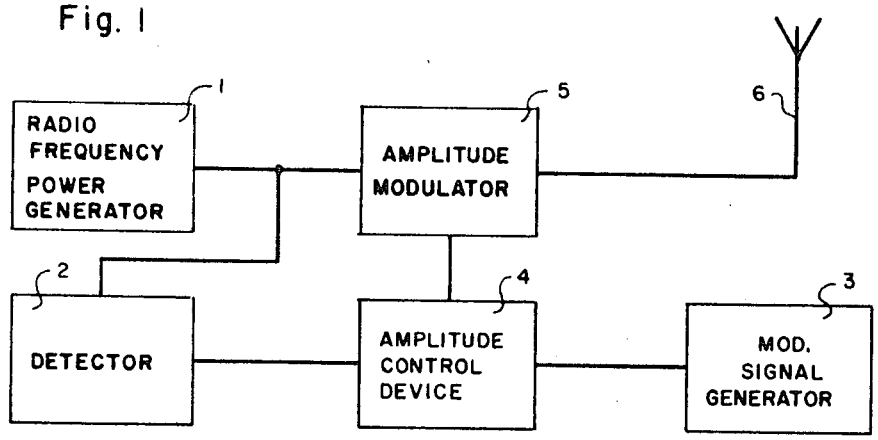

United States Patent [19]
Towle et al.

[11] 3,965,443
[45] June 22, 1976

[54] ELECTRONIC MODULATOR FOR GUIDANCE SYSTEMS

[75] Inventors: Allistair Towle; Stanko Brcic, both of Willowdale, Canada

[73] Assignee: U.S. Philips Corporation, New York, N.Y.

[22] Filed: Sept. 25, 1974

[21] Appl. No.: 509,209

[52] U.S. Cl. ............................ 332/31 R; 332/37 D; 332/38; 332/40; 343/108 SM; 343/109
[51] Int. Cl.² .......................................... H03C 1/06
[58] Field of Search ............. 332/31 R, 31 T, 37 R, 332/37 D, 38, 52, 40, 41, 42; 328/169, 171, 168; 343/108 R, 108 M, 109, 108 SM

[56] References Cited
UNITED STATES PATENTS

| | | |
|---|---|---|
| 2,895,109 | 7/1959 | Weinreich .......................... 332/52 |
| 3,188,581 | 6/1965 | Palmer .......................... 332/37 RX |
| 3,304,505 | 2/1967 | Pricer .......................... 328/171 X |
| 3,422,356 | 1/1969 | Fritts .......................... 332/38 X |
| 3,544,834 | 12/1970 | Bates .......................... 328/168 X |
| 3,851,276 | 11/1974 | Kaplan .......................... 332/31 R |

*Primary Examiner*—Siegfried H. Grimm
*Attorney, Agent, or Firm*—Frank R. Trifari; George B. Berka

[57] ABSTRACT

An amplitude modulation system having a modulation control circuit including a limiter for the modulation signal, a detector for deriving a DC control signal from the unmodulated carrier, a first adjustable network connected to the detector to produce a signal applied to a modulation control circuit for adjusting depth of modulation, and an additional adjustable network connected between the detector and the modulator to produce a signal for adjusting the modulated carrier.

4 Claims, 3 Drawing Figures

ELECTRONIC MODULATOR FOR GUIDANCE SYSTEMS

The present invention relates to a modulation system by means of which the percentage or extent of modulation of a high frequency carrier wave is controlled in relation to the carrier amplitude so that the percentage of modulation remains substantially constant with carrier amplitude variation. The invention further relates to a modulation system in which the amplitude of sidebands produced by different modulation signals are readily controllable and balanceable with respect to each other.

The invention is particularly suitable for use in navigational systems wherein overlapping radio frequency radiation patterns must be accurately controlled with respect to one another in order to provide an accurately controlled and readily adjustable composite pattern. One embodiment of the invention will be described with respect to its use in conjunction with Instrument Landing Systems (ILS) for aircraft.

In radio navigational systems it is often desirable to transmit differently characterized signals on opposite side of a path or course defined thereby. If amplitude relationships of the characterizing signals are critical then for such systems the amplitude relationship of characterizing modulation signals should be controlled with respect to the amplitude of the carrier upon which they are modulated and to each other. It is also desirable that these relationships be readily adjustable.

A known system in current use (ILS) employs a mechanical modulator for producing a signal comprising a carrier and sidebands of 90 and 150 Hz and in addition a signal consisting of the sidebands only. Rotating vane capacitors are used in balanced bridge modulators for producing the desired signals. It is a time consuming operation to change the amplitude relationships of the sidebands with respect to each other and it is difficult to accurately control the percentage of modulation. In fact, adjustment of one of the percentage modulation or sideband amplitude ratio effects the other.

In addition mechanical modulators are cumbersome, expensive and subject to wear and the reliability is not all that may be desired in cases where the operation of the equipment is unattended.

It is accordingly an object of the present invention to provide a modulation system which is electronic in nature rather than mechanical.

It is further object of the invention to provide a modulation system wherein the percentage of modulation is controlled by the carrier being modulated so that over modulation does not take place and/or that the percentage modulation remains constant or varies in a desired manner.

It is a still further object of the invention to provide a modulation system in which the percentage of modulation and/or the carrier-sideband relationships may be readily and quickly adjusted, if necessary.

It is a further object of the invention to provide a modulation system of high reliability.

Further objects and advantages will become apparent as the description proceeds.

In accordance with a concept of the invention a radio frequency carrier, subsequently to be amplitude modulated, is utilized to control the amplitude of the modulating signal in relationship to the amplitude of the carrier in a manner such that the resultant percentage or depth of modulation is based on carrier amplitude. As an extension thereof the carrier may further be utilized in the control of amplitude relationships between two or more modulating signals so that, for instance, in overlapping radiation pattern guidance systems the balance or null point, which represents the "on course" line, can be adjusted to take care of antennae and other imperfections to still provide the accuracy of guidance required.

Figure 2:
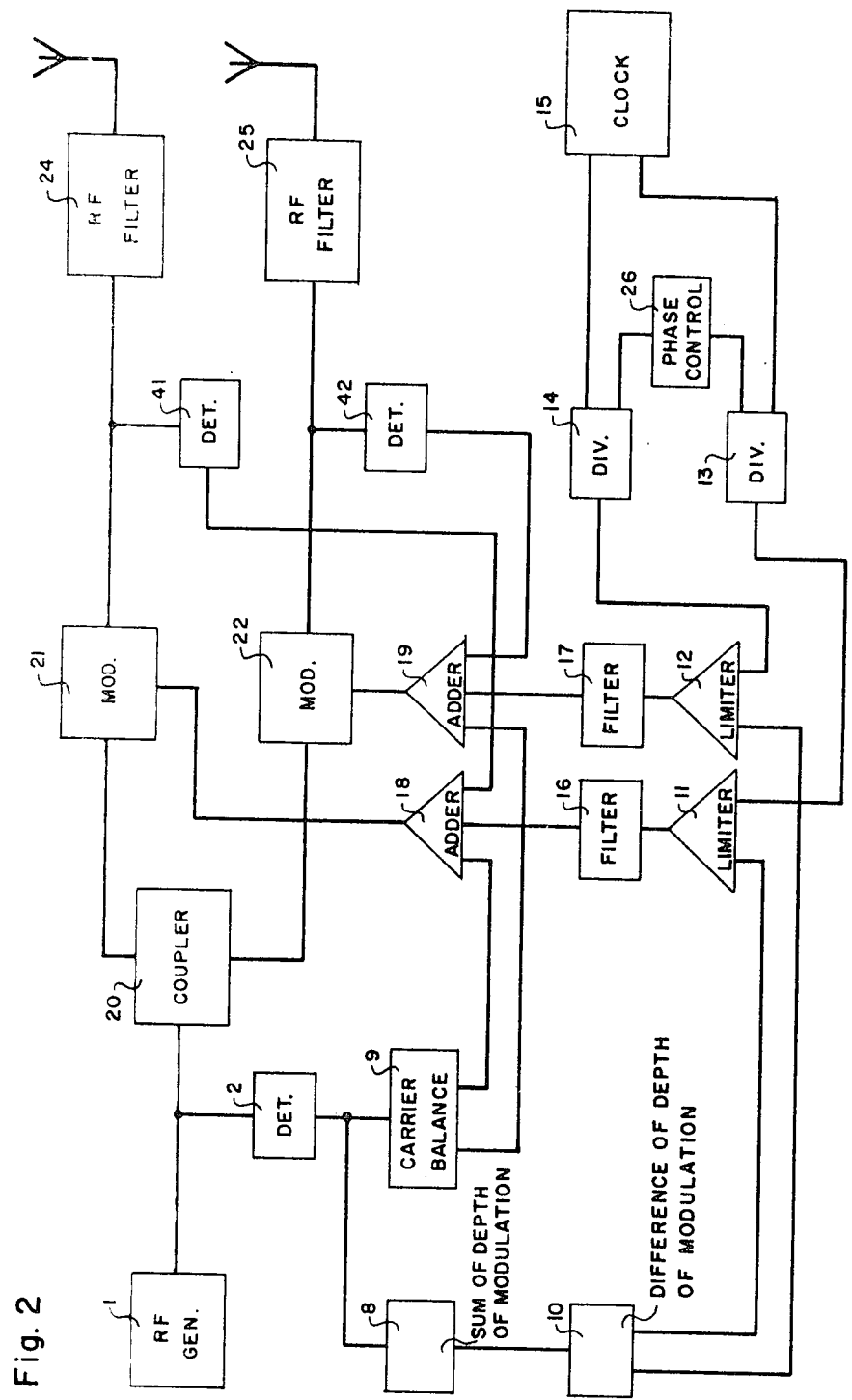

The invention will now be described with reference to the figures of the drawing in which, FIG. 1, shows a block diagram illustrating the concept of carrier controlled modulation, FIG. 2 shows a block diagram of a modulator for an ILS wherein components thereof which are similar to components of FIG. 1 are similarly designated, and FIG. 3, appearing on same sheet as FIG. 1, is a composite block schematic of portion of the embodiment of the invention shown in FIG. 2.

Referring now to FIG. 1 a generator 1 supplies a radio frequency carrier signal to a modulator 5 and simultaneously to an amplitude detector 2 which may be of any suitable type. Detector 2 supplies a direct current control voltage, representative of carrier amplitude, to amplitude control device 4 to which is also supplied a low frequency modulation signal from a generator 3. As a consequence the modulation signal amplitude, supplied to a modulator 5, is related to carrier amplitude due to the direct current control voltage from detector 2. The modulated carrier from modulator 5 is supplied to a transmitting antenna 6. Considering a system wherein the power output of the modulator 5 is proportional to the radio frequency carrier input power and further that the depth of modulation is dependent on the amplitude of the radio frequency carrier input as well as the amplitude of the modulating signal then it will be apparent that the depth of modulation which takes place in modulator 5 will vary with carrier amplitude and with linear detection and amplitude control of the modulating signal the depth of modulation can be maintained constant. This can be a very important feature in navigational systems wherein the resultant indication is dependent on the accuracy of depth of modulation.

An amplitude modulator suitable for use in the system described may be of the attenuating type wherein the attenuation of a radio frequency carrier is controlled by the modulating signal and further wherein the modulated output is detected and the derived modulation signal fed back to the modulation signal input of the modulator in phase opposition to the input modulation signal.

An embodiment of the invention adapted for use in Instrument Landing Systems (ILS) is shown in FIG. 2. In this embodiment it is desirable to transmit overlapping course indicating radiation patterns, each pattern characterized by its own modulation, usually low frequencies of 90 and 150 Hz. An aircraft following the prescribed "course line" will receive amplitude modulated carriers with 90 and 150 Hz modulation signals substantially equal in amplitude. Deviation from the course line will result in a preponderance of one or the other of these signals. It is therefore exceedingly important that the carriers received have the same depth of modulation and further that this situation remains constant so that erroneous indication will not be provided in the aircraft.

In order that this may be achieved the embodiment of FIG. 2 comprises a carrier frequency generator 1 which supplies energy to a radio frequency power divider or coupler 20 feeding two amplitude modulators 21, 22 and also to a detector or rectifier 2 which produces a direct current control voltage related to carrier amplitude. The direct current control voltage is supplied to a device 8 by means of which an adjustable portion of the direct current voltage is selected. Device 8 may take the form of a tapped resistance bleeder network and may be termed a Sum of Depths of Modulation control (SDM). The selected amount of control voltage is supplied to a modulation balance device 10 termed a Difference in Depths of Modulation control (DDM) which feeds inversely variable direct current control voltage to two limiters 11, 12.

Modulation frequency signals of 90 and 150 Hz are provided by a master oscillator or clock 15, operating at 900 Hz, which feeds dividers 13, 14 producing square wave output signals of 90 and 150 Hz respectively. A phase control device 26 may be used to maintain a proper phase relationship between the 90 and 150 Hz signals. The modulation frequency signals are supplied to limiters 11, 12 which control the ouput amplitude thereof in accordance with the direct current control voltages supplied thereto. One form which the limiters may take will be described subsequently with reference to FIG. 3.

The limited modulation frequency signals are passed through filters 16 and 17 in order to remove distortion produced by limiting and are then supplied to adders 18, 19 to each of which is also supplied a direct current voltage derived from a carrier balancing unit 9 fed by the direct current control voltage from detector 2 and a further direct current voltage representing, carrier amplitude at the output of the associated modulator and an audio voltage representing the modulation of the output carrier derived from detectors 41, 42. The outputs of the adders are combinations of direct current and modulation signal voltages.

The carrier balancing unit 9 provides for inverse control of the direct current voltage fed to adders 18, 19 so that the modulators, which are of the attenuating type and preferably using biased "pin" diodes, may be balanced with respect to each other to facilitate carrier balance between the outputs of the modulators.

The modulated outputs of modulators 21, 22 are fed through R.F. filters 24, 25 to associated directional antennae systems which provide the desired directional and overlapping radiation patterns.

In the operation of the system described in FIG. 2 the direct voltage output of detector 2 is tapped off by SDM control 8 and the voltage tapped off is fed to a differential control DDM 10 which produces inversely variable direct current control voltages which are fed to modulation signal limiters 11, 12. The SDM control may be considered as an overall amplitude control for the modulation frequency signals since it determines the maximum output of the limiters.

The DDM control determines the relative amplitude of the two modulation frequency signals. As a consequence the maximum and relative amplitudes of the modulation signals are controllable and the final resulting sidebands may be controlled in overall amplitude and relative to each other. Since the control voltage is related to the radio frequency carrier amplitude the depth of modulation by each modulation signal is controlled.

In addition to the above and in order to achieve carrier balance in the modulator outputs the differential carrier balance control 9 feeds direct current voltages to adders 18, 19 which are added in each case to the modulation signals and the voltages derived from detectors 41, 42. The input to each modulator (of the attenuator type) 21 and 22 consists of a direct current voltage and a modulating signal. THe direct current voltage controls the quiescent attenuation of the modulator, the modulator preferably being of the pin diode modulation hybrid type, and the direct current voltage being applied to the diode to determine the quiescent resistive impedance thereof. The terminating impedances (pin diodes) of the hybrid determine the average carrier amplitude and differential control of the modulator pin diodes by the carrier balance control allows for achieving a carrier balance between the outputs of the modulators.

It will thus be seen that the arrangement in FIG. 2 provides carrier control of depth and balance of modulation as well as carrier balance. It will be apparent to those skilled in the art that the course line for a navigational guidance system supplied by such an arrangement may be readily adjusted to compensate for antennae and other discrepancies and that the relative outputs will be maintained regardless of R.F. power input. This is very desirable when it is considered that such systems must operate unattended in some cases and further operate and provide correct guidance with different values of radio frequency power input. Thus the modulator becomes standard for systems of different powers within the capability of the modulation system.

Figure 3:
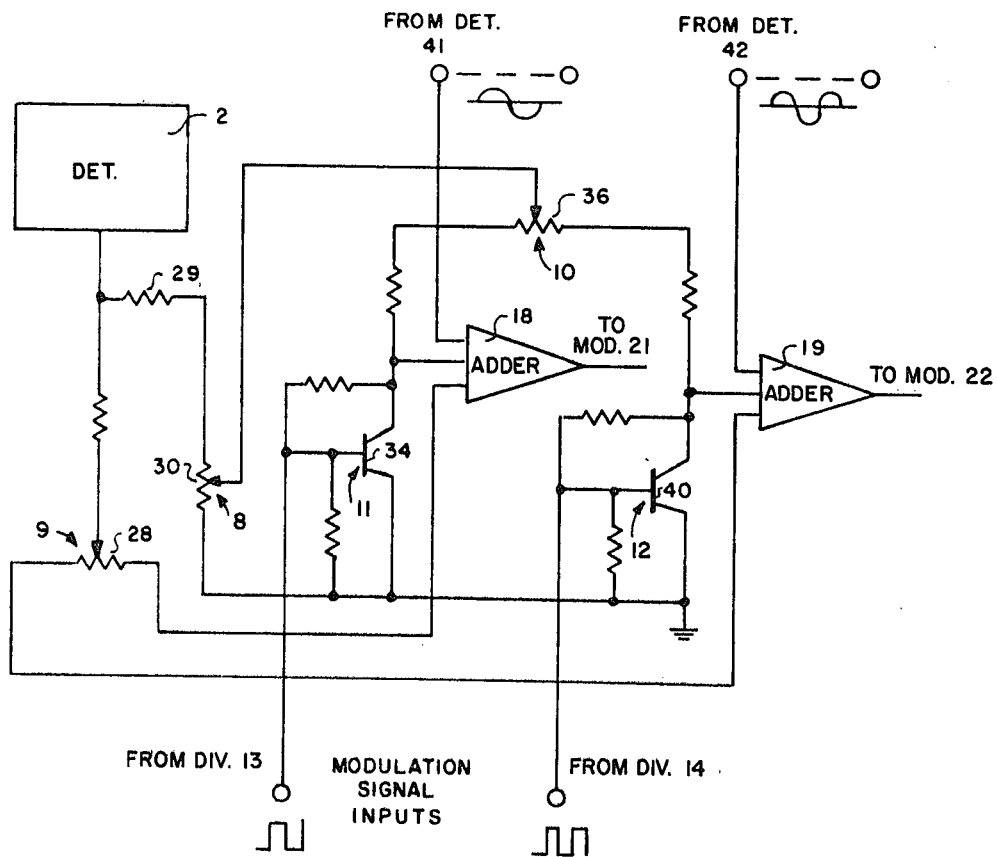

FIG. 3 shows a simplified block-schematic diagram of a portion of the embodiment of FIG. 2 which is concerned with the control and generation of the modulation frequency signals and control voltages.

Detector 2 is shown feeding a direct current voltage to a bleeder network 29, 30. The tap of potentiometer 30 is connected to the center tap of a potentiometer 36 the end terminals of which feed two saturating inverters including transisters 34, 40 to which are also fed the modulation frequency signals. By means of control 30 (SDM) 8 the overall depth of modulation is adjusted by limiting the value of the direct current voltage supplied to transistors 34, 40. Control 36 is modulation balance control which inversely varies the voltage supplied to transistors 34, 40. Control 36 has been termed the Difference in Depth of Modulation 10 control herein. The output of transistors 34, 40 are squared waveforms and in practice the saturating inverters correspond to limiters 11, 12 and filters 16, 17, as shown in FIG. 2.

A further balance control (Carrier Balance 9) 28 supplies selected amounts of direct current voltage to adders 18, 19.

Direct current voltage plus 90 and 150 Hz audio signals are supplied to the adders by detectors 41 and 42.

For example, the output of adder 18 is a direct current voltage dependent on the difference of the voltages supplies by detectors 2 and 41 and a difference modulation voltage of 90 Hz dependent on the difference of the input modulation voltage and the detected modulation voltage from detector 41. Although not shown here a high gain amplifier is preferably used between the adders and the modulators.

The modulators preferably use pin diodes since phase characteristics are excellent and with negative feedback, by way of detectors 41, 42, the modulation characteristics are quite linear and, of course, the power output is proportional to the power input and the depth of modulation is accurately maintained.

It will be clear that the modulation control system according to the present invention may be used in equipments other than those which have been described by way of illustration and not as a limitation on the scope of the invention as set forth in the objects of the invention and as defined by the appended claims.

The embodiments of the invention in which are exclusive property or privilege is claimed are defined as follows:

1. An amplitude modulation system for use in a navigational system where two overlapping signals modulated at different frequencies are transmitted to indicate course, comprising a source of a carrier wave to be modulated, a source of two modulation signals, a detector connected to e source of the carrier wave for deriving a DC control signal related to the amplitude of the carrier wave, two modulators each having an input for the carrier wave, an input for the modulation signal and an output for the modulated carrier, and modulation amplitude control means including two adders each having an output connected to the input for the modulation signal of an assigned modulator and at least two inputs, two limiters each having an output connected to one input of an assigned adder and two inputs, an adjustable first network for dividing the DC control signal from said detector to provide two differential DC signals applied respectively, to one input of each limiter for adjusting the depth of modulation, an adjustable additional network connected to said detector to produce from the DC control signal a signal for adjusting the overall depth of modulation and, derived therefrom, additional two differential DC signals applied respectively, to the other input of each adder for adjusting the carrier balance in respective modulators whereby the other input of each limiter is connected to said source of modulation signals.

2. An amplitude modulation system as claimed in claim 1, wherein each modulator is of the attenuating type with the attenuation being controlled by the modulation signal, the output of the modulator being detected in an additional detector and the resultant modulation signal being fed back in negative feedback relationship to the modulation voltage input of the modulator.

3. An amplitude modulation system as claimed in claim 2 wherein each modulator is of the hybrid type terminated with pin diodes which are variably biased by the modulation voltage.

4. An amplitude modulation system, comprising a modulator (5) to which is supplied a carrier wave and a modulating signal, wherein the depth of modulation of the carrier wave by the modulation signal in the modulator is dependent on the amplitudes of each of the carrier and the modulation signal supplied thereto, and means to control the depth of modulation of the carrier including a further means (2) for producing a control voltage representative of the amplitude of the said carrier and a modulation signal amplitude control means (4) through which the modulation signal is supplied to the modulator (5) and to which the control voltage produced by said further means is supplied to control the amplitude of the modulation signal supplied to the modulator.

* * * * *